United States Patent [19]
Kim et al.

[11] Patent Number: 6,077,573
[45] Date of Patent: *Jun. 20, 2000

[54] PLASMA ENHANCED CHEMICAL VAPOR DEPOSITION METHODS OF FORMING HEMISPHERICAL GRAINED SILICON LAYERS

[75] Inventors: Young-sun Kim, Kyungki-do; Sang-hyeop Lee; Seung-hwan Lee, both of Seoul; Young-wook Park, Kyungki-do; Mikio Takagi, Seoul, all of Rep. of Korea

[73] Assignee: Samsung Electronics Co., Ltd., Rep. of Korea

[ * ] Notice: This patent is subject to a terminal disclaimer.

[21] Appl. No.: 09/083,350

[22] Filed: May 22, 1998

[30] Foreign Application Priority Data

Jun. 11, 1997 [KR] Rep. of Korea ...................... 97-24204

[51] Int. Cl.[7] .............................. H05H 1/24; C23C 16/24
[52] U.S. Cl. ................. 427/578; 427/255.18; 427/255.7; 427/81; 438/253; 438/396
[58] Field of Search .............................. 427/578, 255.7, 427/255.18, 81; 438/396, 253

[56] References Cited

U.S. PATENT DOCUMENTS

| | | | |
|---|---|---|---|
| 4,968,384 | 11/1990 | Asano | 156/643 |
| 5,234,862 | 8/1993 | Aketagawa et al. | 437/103 |
| 5,366,917 | 11/1994 | Watanabe et al. | 437/47 |
| 5,372,962 | 12/1994 | Hirota et al. | 437/47 |
| 5,385,863 | 1/1995 | Tatsumi et al. | 437/109 |
| 5,394,012 | 2/1995 | Kimura | 257/739 |
| 5,405,801 | 4/1995 | Han et al. | 437/60 |
| 5,464,791 | 11/1995 | Hirota | 437/60 |
| 5,486,488 | 1/1996 | Kamiyama | 437/60 |
| 5,543,347 | 8/1996 | Kawano et al. | 437/60 |
| 5,554,557 | 9/1996 | Koh | 437/52 |
| 5,567,637 | 10/1996 | Hirota | 437/43 |
| 5,590,051 | 12/1996 | Yokozawa | 364/496 |
| 5,595,937 | 1/1997 | Mikagi | 437/192 |
| 5,616,511 | 4/1997 | Hirota | 438/396 |
| 5,623,243 | 4/1997 | Watanabe et al. | 257/309 |
| 5,821,152 | 10/1998 | Han et al. | 438/398 |

FOREIGN PATENT DOCUMENTS

| | | | |
|---|---|---|---|
| 4286151A | 10/1992 | Japan | H01L 27/04 |

OTHER PUBLICATIONS

Watanabe, H., et al., Hemispherical Grained Silicon (HSG–Si) Formation on In–Situ Phosphorous Doped Amorphour–Si Using The Seeding Method. *Extended Abstract of the 1992 International Conference on Solid State Devices and Materials*, Tsukuba, pp. 422–424 (Aug. 26–28, 1992).

Watanabe, H., et al., A New Cylindrical Capacitor Using Hemispherical Grained Si (HSG–Si) for 256Mb DRAMs, *IEEE*, pp. 10.1.1–10.1.4 (1992), no month data.

*Primary Examiner*—Roy V. King
*Attorney, Agent, or Firm*—Myers Bigel Sibley & Sajovec

[57] ABSTRACT

A method of forming a microelectronic device includes the step of forming an impurity doped amorphous silicon layer on a microelectronic substrate using plasma-enhanced chemical vapor deposition. The impurity doped amorphous silicon layer is patterned so that portions of the microelectronic substrate are exposed adjacent the patterned amorphous silicon layer. A hemispherical grained silicon layer is then formed on the patterned amorphous silicon layer. Moreover, the step of forming the impurity doped amorphous silicon layer can be performed at a temperature of 400° C. or less.

30 Claims, 3 Drawing Sheets

6,077,573

PLASMA ENHANCED CHEMICAL VAPOR DEPOSITION METHODS OF FORMING HEMISPHERICAL GRAINED SILICON LAYERS

FIELD OF THE INVENTION

The present invention relates to the field of microelectronics and more particularly to methods of forming hemispherical grained silicon layers.

BACKGROUND OF THE INVENTION

In a dynamic random access memory (DRAM) device, the reading capacity of the memory cell can be increased and the soft error rate can be reduced by increasing the capacitance of the memory cell capacitor. Accordingly, increased capacitance for the memory cells can improve the performance of the memory device. As dynamic random access memory devices become more highly integrated, however, the surface area occupied by each memory cell is reduced thus reducing the area available for each memory cell capacitor. It is therefore desirable to maintain a predetermined capacitance for each memory cell capacitor as the space available for each memory cell capacitor is reduced.

There have been efforts to provide increased memory cell capacitance with memory cell capacitors occupying a reduced area of an integrated circuit substrate. In particular, there have been efforts to increase the surface area of a lower capacitor electrode. For example, polysilicon electrodes have been fabricated having fin structures, box structures, and cylindrical structures.

Design rule limitations, however, may make it difficult to gain satisfactory increases in the memory cell capacitance when using the electrode structures discussed above. In addition, the complicated manufacturing steps used to fabricate these three-dimensional structures may result in an increased soft error rate. Accordingly, there continues to exist a need in the art for improved memory cell capacitor structures.

SUMMARY OF THE INVENTION

It is therefore an object of the present invention to provide improved methods of forming capacitor electrodes.

It is another object of the present invention to provide methods of forming improved memory cell capacitors.

It is still another object of the present invention to provide methods of forming improved integrated circuit memory devices.

These and other objects are provided according to the present invention by methods including the steps of forming an impurity doped amorphous silicon layer on a microelectronic substrate using plasma-enhanced chemical vapor deposition, and patterning the impurity doped amorphous silicon layer. In particular, the impurity doped amorphous silicon layer is patterned so that portions of the microelectronic substrate are exposed adjacent the patterned amorphous silicon layer. A hemispherical grained silicon layer is then formed on the patterned amorphous silicon layer.

By forming the amorphous silicon layer using plasma-enhanced chemical vapor deposition, the uniformity of the hemispherical grained layer formed thereon can be improved. More particularly, the impurity doped amorphous silicon layer is preferably formed at a temperature of 400° C. or less. By forming the amorphous silicon layer at a temperature of 400° C. or less, the uniformity of the hemispherical grained silicon layer can be further improved.

The step of forming the impurity doped amorphous silicon layer can be performed using a gas such as silane or disilane. Moreover, the step of forming the hemispherical grained silicon layer can be preceded by the step of cleaning the patterned amorphous silicon layer and the exposed portion of the microelectronic substrate. By cleaning the patterned amorphous silicon layer, the uniformity of the hemispherical grained silicon layer formed thereon can be further improved. In addition, the hemispherical grained silicon layer can be a hemispherical grained polysilicon layer.

In addition, the step of forming the impurity doped amorphous silicon layer can be preceded by the step of forming a preliminary impurity doped amorphous silicon layer on the microelectronic substrate using low pressure chemical vapor deposition. The use of low pressure chemical vapor deposition can provide increased step coverage for the amorphous silicon layer, thus promoting the formation of the layer in and around contact holes.

The methods of the present invention can be used to provide improved memory cell capacitors for integrated circuit memory devices. In particular, a memory cell access transistor can be formed on a substrate, and an insulating layer can be formed over the memory cell access transistor and the substrate. A contact hole can be formed in the insulating layer exposing a source/drain region of the memory cell access transistor and the substrate. The impurity doped amorphous silicon layer according to the present invention is thus formed on the insulating layer and patterned to provide a lower capacitor electrode electrically coupled to the source/drain region of the memory cell access transistor through the contact hole. A hemispherical grained silicon layer is then formed on the patterned amorphous silicon layer, thus increasing the surface area thereof. A dielectric layer is formed on the hemispherical grained silicon layer, and a second conductive layer is provided on the dielectric layer to provide a memory cell capacitor.

According to the methods of the present invention, the uniformity of a hemispherical grained silicon layer can be improved. Accordingly, increased memory cell capacitance can be provided for highly integrated circuit memory devices thereby increasing the performance of integrated circuit memory devices including these memory cell capacitors.

DETAILED DESCRIPTION

Figure 1:
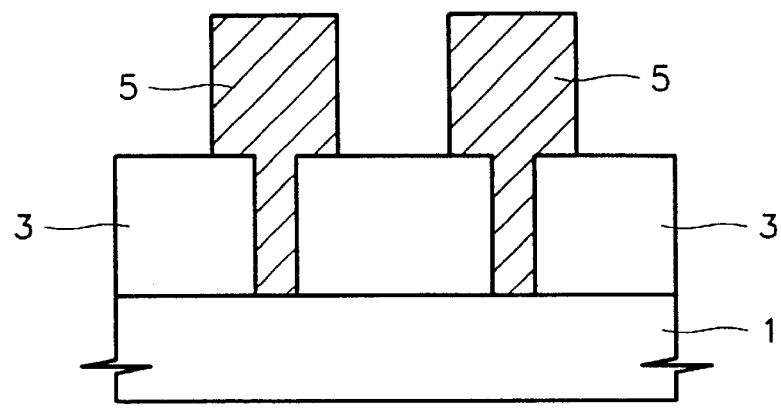
FIGS. 1 through 3 are cross-sectional views illustrating steps of a first method of forming a capacitor for an integrated circuit memory device according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 2:
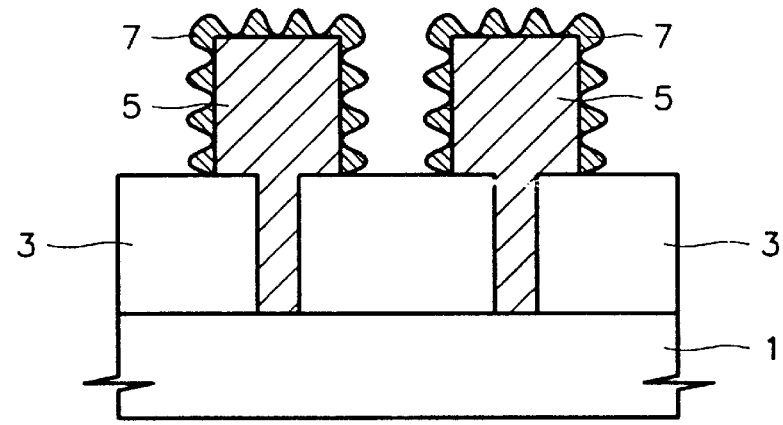
Figure 3:
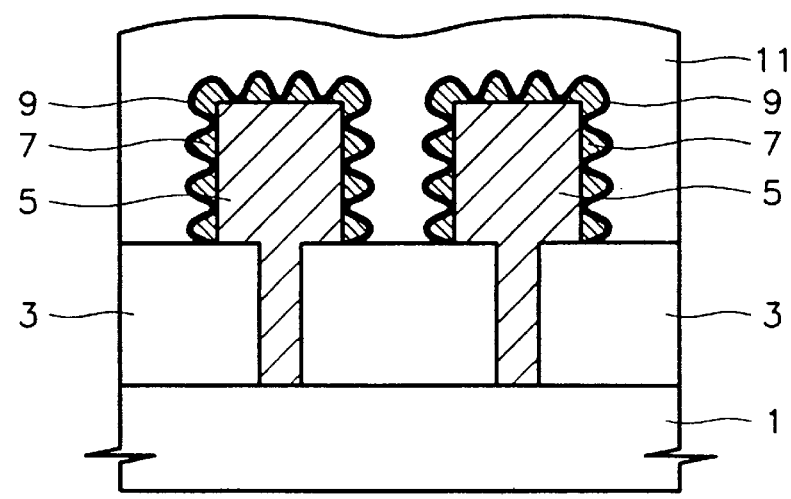

The method of forming a capacitor for an integrated circuit device according to the present invention will now be discussed with reference to FIGS. 1–3. In particular, a memory cell access transistor can be formed on a semiconductor substrate 1 and an insulating layer 3 can be formed on the memory cell access transistor and on the substrate 1. A contact hole can be formed through the insulating layer 3 thereby exposing a source/drain region of the memory cell access transistor in the substrate 1. As will be understood, a plurality of such structures can be formed on the substrate 1, and two such structures are illustrated in the steps of FIGS. 1–3.

An impurity doped amorphous silicon layer is formed by plasma-enhanced chemical vapor deposition (PECVD) wherein the impurity doped amorphous silicon layer fills the contact hole. This impurity doped amorphous silicon layer is then patterned to provide the patterned amorphous silicon layer 5 as shown in FIG. 1. As shown, the patterned amorphous silicon layer 5 includes a plurality of electrode structures on the insulating layer 3 wherein each of the electrode structures is electrically coupled with the substrate 1 through a respective contact hole through the insulating layer 3. More particularly, the impurity doped amorphous silicon layer is preferably formed at a temperature of 400° C. or less, and the patterned amorphous silicon layer 5 provides the lower capacitor electrodes.

By forming the impurity doped amorphous silicon layer at a relatively low temperature, the uniformity of a hemispherical grained silicon (HSG-Si) layer formed on the patterned amorphous silicon layer 5 can be improved. The amorphous silicon layer can be doped in-situ wherein the layer is formed and doped simultaneously. Alternately, the amorphous silicon layer can be formed and then doped using an ion implant step. Moreover, the impurity doped amorphous silicon layer can be doped with an impurity such as phosphorous (P), arsenic (As), or boron (B).

The structure can then be wet-cleaned to remove contaminants from the exposed portions of the insulating layer 3 and from the exposed portions of the patterned amorphous silicon layer 5. This wet-clean can improve the uniformity with which a hemispherical grained silicon layer can be formed on the patterned amorphous silicon layer 5. A hemispherical grained silicon (HSG-Si) layer 7 is then formed on the exposed portions of the patterned amorphous silicon layer 5. Because the patterned amorphous silicon layer 5 is formed at a temperature of 400° C. or less, the HSG-Si layer 7 can be formed with greater uniformity.

A dielectric layer 9, such as a nitride/oxide (NO) layer, can then be formed on the HSG-Si layer 7 as shown in FIG. 3. A second capacitor electrode, such as a doped polysilicon layer 11, can then be formed on the dielectric layer 9 opposite the HSG-Si layer 7. The polysilicon layer 11 can thus provide an upper capacitor electrode for the integrated circuit device.

The steps of forming the HSG-Si layer of the present invention will now be discussed in greater detail. The HSG-Si layer 7 can be formed using a physical phenomenon which occurs during a phase transition of amorphous silicon into crystalline silicon. In particular, a roughened silicon seed can be formed to a desired thickness using silane ($SiH_4$) or disilane ($Si_2H_6$) as a silicon source when forming the HSG-Si layer on an amorphous silicon layer. The structure is heated so that hemispherical micro-grains are formed on the surface of the amorphous silicon layer to provide the HSG-Si layer having the irregular (hemispherical) surface. By forming the HSG-Si layer, the surface area of the lower capacitor electrode can be two to three times greater than that of the electrode without the HSG-Si layer.

The uniformity of the HSG-Si layer 7 on the patterned amorphous silicon layer 5 can be improved by reducing the crystalline grains and/or contamination of the patterned amorphous silicon layer 5 during the formation of the HSG-Si layer 7. Surface movement of the amorphous silicon atoms in the doped and patterned amorphous silicon layer 5 may be suppressed if even a trace of the patterned amorphous silicon layer 5 is crystallized or if the surface of the patterned amorphous silicon layer 5 is contaminated with a foreign substance. Crystallization and/or contamination of the patterned amorphous silicon layer may thus reduce the generation and growth of crystal nuclei thus making it difficult to form the HSG-Si layer 7 uniformly.

Figure 4:
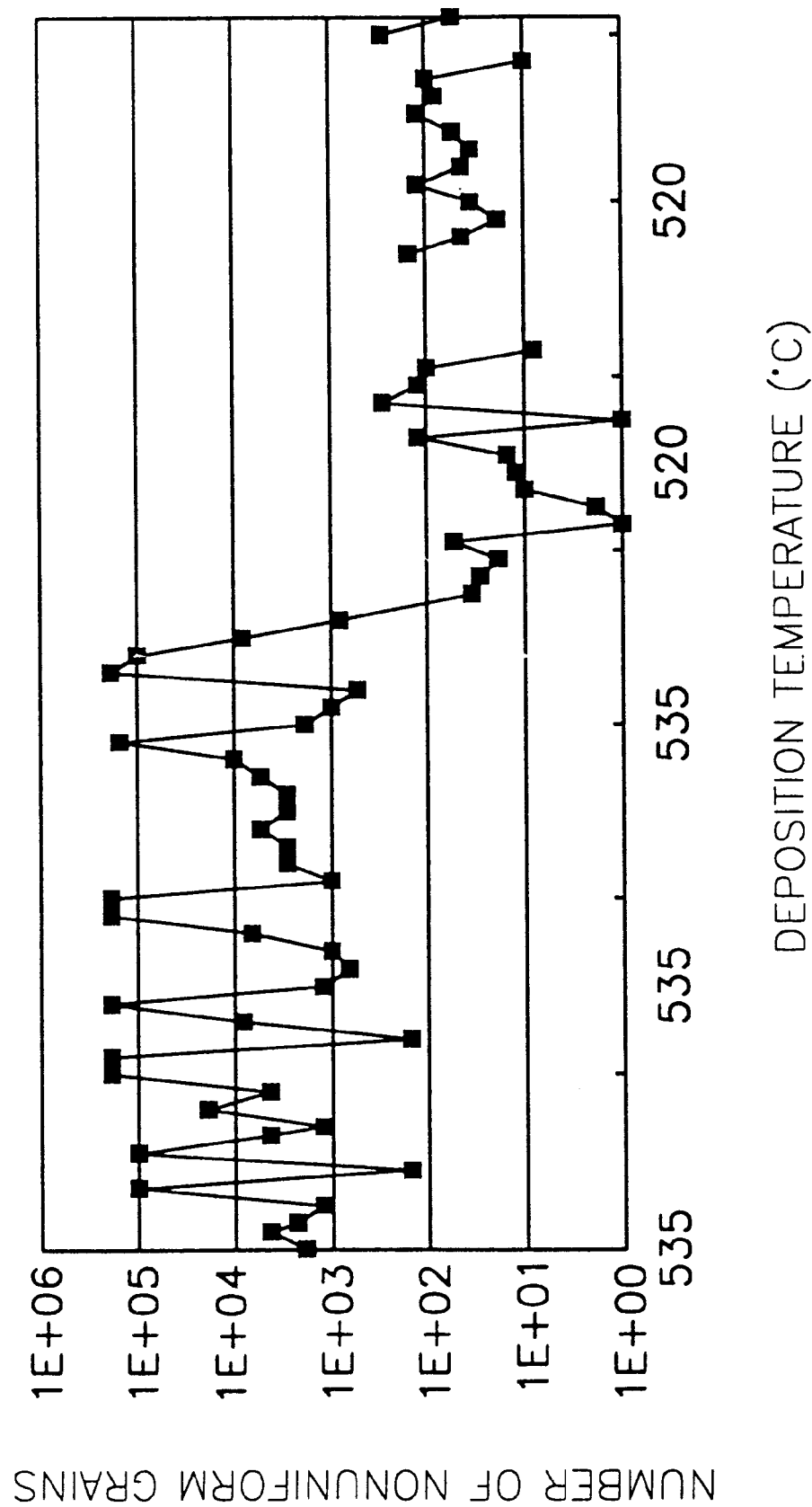
FIG. 4 is a graph illustrating a relationship between the deposition temperature of an impurity doped amorphous silicon layer and a uniformity of grains of a hemispherical grained silicon (HSG-Si) layer formed according to the present invention.

The crystallization of the patterned amorphous silicon layer 5 is dependent on the deposition conditions during the formation of the HSG-Si layer 7. As the deposition temperature of the impurity doped amorphous silicon layer increases, the number of grains increase as shown in FIG. 4. As shown, on the order of several thousand non-uniform grains may occur when the deposition temperature of the impurity doped amorphous silicon layer is 535° C. The number of grains may be reduced to on the order of several hundred, however, when the deposition temperature is lowered to 520° C. To increase the size of the grains of the HSG-Si layer 7, the deposition temperature of the HSG-Si layer 7 is preferably increased. If the deposition temperature is increased to increase the size of the grains of the HSG-Si layer 7, a number of non-uniform grains of the HSG-Si layer 7 may also increase. The deposition temperature of the impurity doped amorphous silicon layer is thus reduced to thereby increase the sizes of the grains of the HSG-Si layer 7 while reducing the formation of non-uniform grains. In particular, the impurity doped amorphous silicon layer is preferably formed using a plasma-enhanced chemical vapor deposition (PECVD) technique at a temperature of 400° C. or less.

Figure 5:
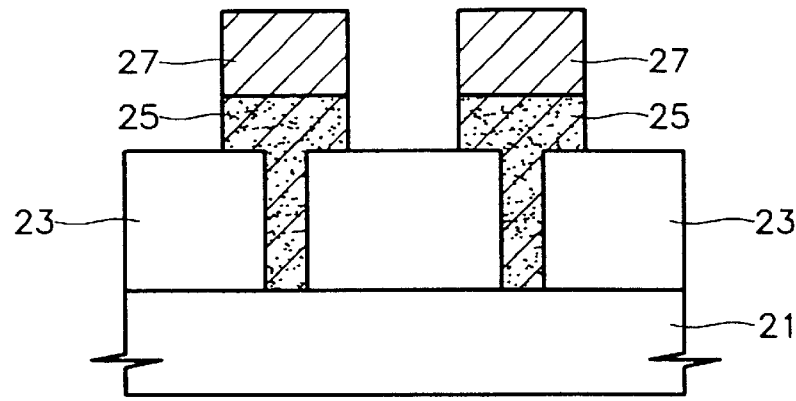
FIGS. 5 through 7 are cross-sectional views illustrating steps of a second method of forming a capacitor for an integrated circuit memory device according to the present invention.
Figure 6:
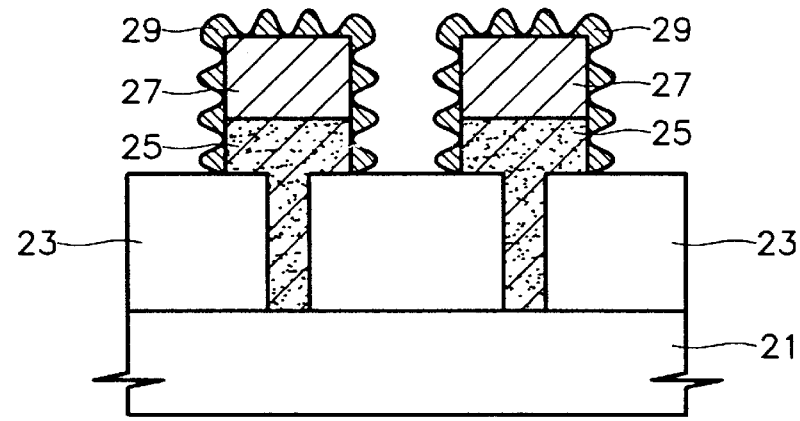
Figure 7:
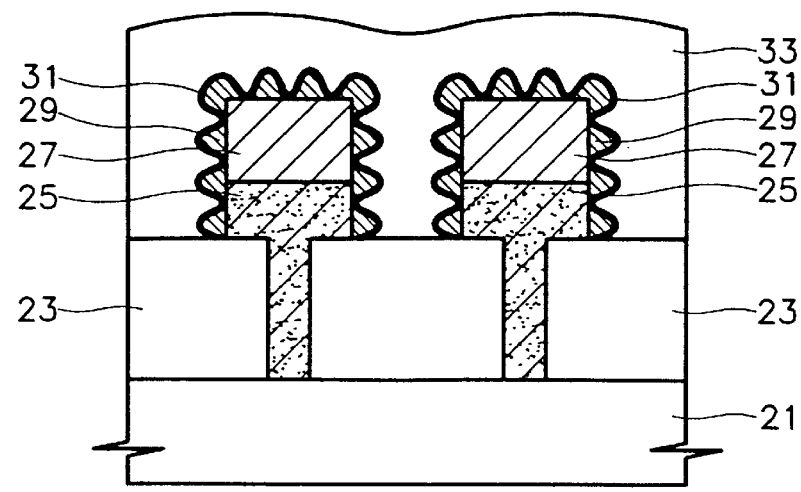

FIGS. 5 through 7 are cross-sectional views illustrating steps of a second method of forming an integrated circuit device according to the present invention. A memory cell access transistor can be formed on a semiconductor substrate 21, and an insulating layer 23 can be formed on the memory cell access transistor and on the substrate 21. A contact hole can be formed in the insulating layer 23, thereby exposing a source/drain region of the memory cell access transistor in the substrate 21.

A first impurity doped amorphous silicon layer is then formed using a low pressure chemical vapor deposition (LPCVD) technique so that the first impurity doped amorphous silicon layer fills the contact hole. A second impurity doped amorphous silicon layer is then formed on the first impurity doped amorphous silicon layer using a plasma-enhanced chemical vapor deposition (PECVD) technique. The second impurity doped amorphous silicon layer is preferably formed at a temperature of 400° C. or less.

By forming the second impurity doped amorphous silicon layer at the relatively low temperature, the uniformity of a hemispherical grained silicon (HSG-Si) layer formed thereon can be improved. The use of the first impurity doped amorphous silicon layer formed using a low pressure chemical vapor deposition technique can improve the step coverage over the insulating layer 23 and through the contact holes therein. The first and second impurity doped amorphous silicon layers can each be doped in-situ wherein each layer is formed and doped simultaneously. Alternately, each of the layers can be formed and then doped using an ion implant step. Each of these layers can be doped with impurities such as phosphorous (P), arsenic (As), or boron (B).

The first and second impurity doped amorphous silicon layers are then patterned to provide the first and second patterned amorphous silicon layers 25 and 27 as shown in FIG. 5. The first and second patterned amorphous silicon layers 25 and 27 together provide the lower capacitor electrodes. A shown in FIG. 5, the plurality of such lower capacitor electrodes can be formed wherein each of the lower capacitor electrodes is electrically coupled with the substrate 21 through respective contact holes through the insulating layer 23.

The structure is then wet-cleaned to remove contaminants from the exposed portions of the insulating layer 23 and the patterned amorphous silicon layers. By cleaning the exposed surfaces of the patterned amorphous silicon layers 25 and 27, the uniformity of a hemispherical grained silicon (HSG-Si) layer can be improved.

A hemispherical grained silicon (HSG-Si) layer 29 is then formed on the exposed surfaces of the first and second patterned amorphous silicon layers 25 and 27. Because the second patterned amorphous silicon layer 27 is formed at a temperature of 400° C. or less, the uniformity of the HSG-Si layer 29 can be improved as discussed above with regard to FIGS. 1–3.

A dielectric layer 31, such as a nitride/oxide (NO) layer, is then formed on the HSG-Si layer 29 as shown in FIG. 7. A second capacitor electrode, such as an impurity doped polysilicon layer 33, is then formed on the dielectric layer 9. The polysilicon layer 33 can thus be used to provide an upper capacitor electrode for an integrated circuit memory device. More particularly, the patterned amorphous silicon layers 25 and 27 together with the HSG-Si layer 29 provide lower capacitor electrodes while the polysilicon layer 33 provides a common upper capacitor electrode for a plurality of memory cell capacitors with a lower electrode of each capacitor being electrically coupled with a respective memory cell access transistor through respective contact holes through the insulating layer 23.

As discussed above, the uniformity of a HSG-Si layer can be improved by forming an impurity doped amorphous silicon layer at a relatively low temperature using a plasma-enhanced chemical vapor deposition technique. Accordingly, the surface area of the lower capacitor electrode can be increased, thereby increasing the surface area of the capacitor electrode and increasing the capacitance of the resulting capacitor. By forming memory cell capacitors using the methods discussed above, the performance of highly integrated DRAM devices can be improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an electrode structure for a microelectronic device, said method comprising the steps of:

forming an impurity doped amorphous silicon layer on a microelectronic substrate using plasma enhanced chemical vapor deposition (PECVD);

patterning said impurity doped amorphous silicon layer so that portions of said microelectronic substrate are exposed adjacent said patterned amorphous silicon layer; and forming a hemispherical grained silicon (HSG-Si) layer on said patterned amorphous silicon layer.

2. A method according to claim 1 wherein said step of forming said impurity doped amorphous silicon layer is performed at a temperature of 400 degrees C. or less.

3. A method according to claim 1 wherein said step of forming said impurity doped amorphous silicon layer is performed using a gas selected from the group consisting of silane ($SiH_4$) and disilane ($Si_2H_6$).

4. A method according to claim 1 wherein said step of forming said hemispherical grained silicon layer is preceded by the step of cleaning said patterned amorphous silicon layer.

5. A method according to claim 1 wherein said hemispherical grained silicon layer comprises a hemispherical grained polysilicon layer.

6. A method according to claim 1 wherein said step of forming said impurity doped amorphous silicon layer is preceded by the step of:

forming an insulating layer on said microelectronic substrate wherein said insulating layer has a contact hole therein exposing a portion of said microelectronic substrate so that said patterned amorphous silicon layer is electrically coupled with said exposed portion of said microelectronic substrate through said contact hole.

7. A method according to claim 1 wherein said step of forming said impurity doped amorphous silicon layer is preceded by the step of:

forming a preliminary impurity doped amorphous silicon layer on said microelectronic substrate using low pressure chemical vapor deposition (LPCVD).

8. A method according to claim 1 wherein said step of forming said hemispherical grained silicon layer is followed by the steps of:

forming a dielectric layer on said hemispherical grained silicon layer; and forming a conductive layer on said dielectric layer.

9. A method of forming an electrode structure for a microelectronic device, said method comprising the steps of:

forming a first impurity doped amorphous silicon layer on a microelectronic substrate using low pressure chemical vapor deposition (LPCVD);

forming a second impurity doped amorphous silicon layer on said first impurity doped amorphous silicon layer using plasma enhanced chemical vapor deposition (PECVD);

patterning said first and second impurity doped amorphous silicon layers so that portions of said microelectronic substrate are exposed adjacent said patterned amorphous silicon layers; and forming a hemispherical grained silicon (HSG-Si) layer on said patterned amorphous silicon layers.

10. A method according to claim 11 wherein said step of forming said second impurity doped amorphous silicon layer is performed at a temperature of 400 degrees C. or less.

11. A method according to claim 11 wherein said step of forming said second impurity doped amorphous silicon layer is performed using a gas selected from the group consisting of silane ($SiH_4$) and disilane ($Si_2H_6$).

12. A method according to claim 11 wherein said step of forming said hemispherical grained silicon layer is preceded by the step of cleaning said patterned amorphous silicon layers.

13. A method according to claim 11 wherein said hemispherical grained silicon layer comprises a hemispherical grained polysilicon layer.

14. A method according to claim 11 wherein said step of forming said first impurity doped amorphous silicon layer is preceded by the step of:

forming an insulating layer on said microelectronic substrate wherein said insulating layer has a contact hole therein exposing a portion of said microelectronic substrate so that said first patterned amorphous silicon layer is electrically coupled with said exposed portion of said microelectronic substrate through said contact hole.

15. A method according to claim 9 wherein said step of forming said hemispherical grained silicon layer is followed by the steps of:

forming a dielectric layer on said hemispherical grained silicon layer; and forming a conductive layer on said dielectric layer.

16. A method of forming a microelectronic device, said method comprising the steps of:

forming an insulating layer on a microelectronic substrate wherein said insulating layer has a contact hole therein exposing a portion of said microelectronic substrate;

forming an impurity doped amorphous silicon layer on said insulating layer using plasma enhanced chemical vapor deposition (PECVD) wherein said impurity doped amorphous silicon layer is electrically coupled with said exposed portion of said microelectronic substrate through said contact hole;

patterning said impurity doped amorphous silicon layer so that portions of said insulating layer are exposed adjacent said patterned amorphous silicon layer and so that said patterned amorphous silicon layer is electrically coupled with said exposed portion of said microelectronic substrate through said contact hole; and forming a hemispherical grained silicon (HSG-Si) layer on said patterned amorphous silicon layer.

17. A method according to claim 16 wherein said step of forming said impurity doped amorphous silicon layer is performed at a temperature of 400 degrees C. or less.

18. A method according to claim 16 wherein said step of forming said impurity doped amorphous silicon layer is performed using a gas selected from the group consisting of silane ($SiH_4$) and disilane ($Si_2H_6$).

19. A method according to claim 16 wherein said step of forming said hemispherical grained silicon layer is preceded by the step of cleaning said patterned amorphous silicon layer.

20. A method according to claim 16 wherein said hemispherical grained silicon layer comprises a hemispherical grained polysilicon layer.

21. A method according to claim 16 wherein said step of forming said impurity doped amorphous silicon layer is preceded by the step of:

forming a preliminary impurity doped amorphous silicon layer on said insulating layer using low pressure chemical vapor deposition (LPCVD).

22. A method according to claim 16 wherein said step of forming said hemispherical grained silicon layer is followed by the steps of:

forming a dielectric layer on said hemispherical grained silicon layer; and forming a conductive layer on said dielectric layer.

23. A method according to claim 16 wherein said step of forming said insulating layer is preceded by the step of forming a memory cell access transistor on said substrate wherein a source/drain region of said memory cell access transistor is exposed by said contact hole.

24. A method of forming a microelectronic device, said method comprising the steps of:

forming an insulating layer on a microelectronic substrate wherein said insulating layer has a contact hole therein exposing a portion of said microelectronic substrate;

forming a first impurity doped amorphous silicon layer on said insulating layer using low pressure chemical vapor deposition (LPCVD) wherein said first impurity doped amorphous silicon layer is electrically coupled with said exposed portion of said microelectronic substrate through said contact hole;

forming a second impurity doped amorphous silicon layer on said first impurity doped amorphous silicon layer using plasma enhanced chemical vapor deposition (PECVD);

patterning said first and second impurity doped amorphous silicon layers so that portions of said insulating layer are exposed adjacent said patterned amorphous silicon layers and so that said patterned amorphous silicon layers are electrically coupled with said exposed portion of said microelectronic substrate; and forming a hemispherical grained silicon (HSG-Si) layer on said patterned amorphous silicon layers.

25. A method according to claim 24 wherein said step of forming said second impurity doped amorphous silicon layer is performed at a temperature of 400 degrees C. or less.

26. A method according to claim 24 wherein said step of forming said second impurity doped amorphous silicon layer is performed using a gas selected from the group consisting of silane ($SiH_4$) and disilane ($Si_2H_6$).

27. A method according to claim 24 wherein said step of forming said hemispherical grained silicon layer is preceded by the step of cleaning said patterned amorphous silicon layers.

28. A method according to claim 24 wherein said hemispherical grained silicon layer comprises a hemispherical grained polysilicon layer.

29. A method according to claim 24 wherein said step of forming said hemispherical grained silicon layer is followed by the steps of:

forming a dielectric layer on said hemispherical grained silicon layer; and forming a conductive layer on said dielectric layer.

30. A method according to claim 24 wherein said step of forming said insulating layer is preceded by the step of forming a memory cell access transistor on said substrate wherein a source/drain region of said memory cell access transistor is exposed by said contact hole.

* * * * *